US006823292B2

(12) United States Patent
Spencer

(10) Patent No.: US 6,823,292 B2
(45) Date of Patent: Nov. 23, 2004

(54) TUNEABLE FILTER

(75) Inventor: Adrian G. Spencer, Horley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 60 days.

(21) Appl. No.: 10/265,578

(22) Filed: Oct. 7, 2002

(65) Prior Publication Data

US 2003/0083836 A1 May 1, 2003

(30) Foreign Application Priority Data

Nov. 1, 2001 (GB) .............................................. 0126219

(51) Int. Cl.$^7$ ............................................. H03H 11/10
(52) U.S. Cl. ........................... 702/190; 702/75; 702/76; 702/81; 702/84; 702/122; 455/183; 333/17.1
(58) Field of Search .............................. 702/75, 76, 81, 702/84, 122, 190; 455/161.2, 164.2, 165.1, 169.1, 169.2, 170.1, 182.1, 182.3, 182.2, 185.1, 186.1, 192.1, 192.3, 193.3, 194.2, 195.1, 196.1, 207–209, 260, 262, 264, 183.2; 331/15, 16, 18, 25, 362, 36 C; 334/15, 17

(56) References Cited

U.S. PATENT DOCUMENTS

| 3,651,409 A | * | 3/1972 | George et al. ........... 455/198.1 |
| 4,025,855 A | * | 5/1977 | Atkinson ..................... 455/109 |
| 4,085,371 A | * | 4/1978 | Mogi et al. ............... 455/182.3 |
| 4,127,822 A | * | 11/1978 | Mogi et al. ............... 455/182.3 |
| 4,130,804 A | * | 12/1978 | Mogi et al. ............... 455/186.1 |
| 4,288,875 A | * | 9/1981 | Carter ....................... 455/195.1 |
| 4,384,365 A | * | 5/1983 | Malinowski et al. ..... 455/183.2 |
| 4,433,315 A | * | 2/1984 | Vandegraaf .................. 333/174 |
| 4,442,548 A | * | 4/1984 | Lehmann .................. 455/196.1 |
| 6,081,700 A |   | 6/2000 | Salvi et al. ............... 455/193.3 |
| 6,307,442 B1 | * | 10/2001 | Meyer et al. ............... 333/17.1 |

FOREIGN PATENT DOCUMENTS

| WO | WO0003538 | 7/1999 | ............ H04N/5/44 |
| WO | WO0141424 | 11/2000 | ............ H04N/5/00 |
| WO | WO0176067 | 3/2001 | ............. H04J/5/24 |

* cited by examiner

Primary Examiner—Marc S. Hoff
Assistant Examiner—Carol S Tsai
(74) Attorney, Agent, or Firm—Aaron Waxler

(57) ABSTRACT

A tuneable filter, for example an antenna filter in a single chip radio receiver, comprises a frequency selective circuit (12) including passive reactive components. At least some of the reactive components (48 to 52) are arranged as a bank (46) which includes switches (53 to 57) for switching at least one of the reactive components in the bank into the frequency selective circuit. A controller controls the switching means to select the or a combination of the reactive components which provides an optimum sensitivity for an input signal at a first frequency. The switch settings required to optimise the sensitivity for other frequencies is determined by measuring the decrease in sensitivity for other switch settings, with the input signal still at the first frequency, and using stored data about the shape of the frequency response of the tuneable filter.

14 Claims, 3 Drawing Sheets

$\text{Tan } \theta = \Delta RSSI / (f_0 - f_L)$

TUNEABLE FILTER

The present invention relates to a tuneable filter, a signal receiving or transceiving device comprising a tuneable filter, and to a method of calibrating a tuneable filter. The tuneable filter may be, in particular but not exclusively, an antenna filter.

Currently produced transceivers used in cordless and cellular telephones typically comprise two principal integrated circuits (ICs) one of which contains the radio front end and the other of which contains the digital processing and is sometimes referred to as the "back-end". The front-end radio IC must amplify weak, radio frequency (RF) signals, hence the transistors are operating in their linear region and amplify with minimum distortion. Normally the front-end radio IC is implemented in a fabrication process with bipolar devices as these provide superior performance when operating at RF compared to CMOS devices (in terms of amplification, distortion, linearity and noise). For the back-end IC, a CMOS process is generally used because these devices provide a very low power consumption and a high packing density.

In choosing to fabricate a single chip radio the architecture may require RF components to be integrated on a digital CMOS IC. This means that CMOS transistors are used instead of bipolar transistors for the RF front-end circuits. Processes such as the Philips CMOS 18 (or C18), where 18 refers to the minimum length of a device viz. 0.18 $\mu$m, have been characterised for RF.

A disadvantage of having to use a CMOS process is that analogue passive components have larger tolerances than either discrete devices or those fabricated using bipolar transistor processes. The tolerances are frequently batch dependent so that the values of the passive components may vary from a true value in the same direction. Such passive components are used in circuits such as oscillators and filters to provide frequency selectivity but the relatively large tolerances will lead to a large range of values being possible risking the frequency selective circuits being tuned too far from the correct value. This may cause the wanted RF signals to be heavily attenuated or distorted, so rendering the entire receiver chip unusable, resulting in a poor yield and a consequent unacceptably high cost of production.

U.S. Pat. specification No. 6,081,700 discloses a radio having a self-tuning antenna and a method of tuning the antenna by way of applying a control voltage to a varactor diode so that the antenna can achieve a peak or predetermined quality level. A controller, which may be a DSP (digital signal processor), generates a calibration signal which is radiated within the radio. The signal is received at the antenna and is processed by receiver circuitry. The controller measures the quality of received signal and the result of the measurement is used to control the tuning of the antenna. The quality metric which may be measured can be either the received signal strength indicator (RSSI), bit error rate (BER) or signal to noise ratio.

For a single channel radio receiver the value of the control voltage applied to the varactor may be stored and subsequently updated to re-peak or retune the receiver. Values of control voltages for tuning the antenna for a plurality of radio channels may also stored for subsequent use. Also in order to enable the antenna to operate over a band of channels, the band can be characterised by control voltages at various points in the operating band and that information can be stored and either utilised for tuning the antenna to cover sub-band segments or to generate tuning voltages interpolated from the stored information. The measurement of tuning voltages for a plurality of radio channels requires the generation of a calibration signal for each of the radio channels and a period of time to evaluate the optimum tuning voltage.

An object of the present invention is to provide an improved tuneable filter, an improved device comprising a tuneable filter and an improved method of calibrating a tuneable filter.

According to a first aspect of the present invention there is provided a signal receiving device comprising a tuneable filter and a control means, wherein the tuneable filter comprises an input for applying a signal at a first frequency, an output for delivering the filtered signal and a variable reactance means, and wherein the control means comprises means for generating a control signal for varying the reactance of the variable reactance means, measurement means for measuring a post-filter signal quality, first storage means comprising data relating the degree of off-tune of the filter to a consequent signal quality, and second storage means for storing an indication of a control signal value and an indication of a frequency, wherein the control means is operable to tune the filter to the input signal at the first frequency by determining a first value of the control signal which produces a peak signal quality, to off-tune the filter from the first frequency by selecting a second value of the control signal, to measure the off-tune signal quality, to determine a peak frequency of the off-tune filter by using the peak signal quality, the measured off-tune signal quality and the data relating the degree of off-tune to the consequent signal quality, and to store an indication of the second value of the control signal and an indication of the peak frequency of the off-tune filter.

According to a second aspect of the present invention there is provided a transceiver device comprising a receiver part and a transmitter part, wherein the receiver part comprises a signal receiving device in accordance with the first aspect of the invention.

According to a third aspect of the present invention there is provided a tuneable filter comprising a variable reactance means, wherein the variable reactance means comprises a bank of selectable capacitors.

According to a fourth aspect of the present invention there is provided a method of calibrating a tuneable filter having a variable reactance means, the reactance of the variable reactance means being controllable by a control signal, the method comprising supplying the tuneable filter with a signal having a first frequency, tuning the filter by determining a first value of the control signal which produces a peak post-filter signal quality, off-tuning the filter by selecting a second value of the control signal and measuring the resulting off-tune signal quality, determining a peak frequency of the off-tune filter by using the peak signal quality, the off-tune signal quality and data relating the degree of off-tune to the consequent signal quality, and storing an indication of the second value of the control signal and an indication of the peak frequency of the off-tune filter.

By requiring a signal at only a single frequency for calibration of the tuneable filter, the generation of calibration signals at a plurality of frequencies is avoided. By employing off-tune measurements of signal quality and using data relating the degree of off-tune to the consequent signal quality, the time required for determining the optimum tuning is reduced.

Optionally the filter may be calibrated for a plurality of frequencies by off-tuning the filter by various amounts using various values of the control signal, measuring, for each value of the control signal, the resulting off-tune signal quality and determining the corresponding peak frequency of the off-tune filter, and storing an indication of each value of the control signal and a corresponding indication of the peak frequency of the off-tune filter.

The stored indications may be used to determine further values of the control signal and corresponding peak frequencies by interpolation or extrapolation, and optionally the further values may be stored.

In operation, after calibration, the stored indications may be used to select an appropriate value of the control signal for operating on a particular frequency. In particular, for operation in a frequency hopped system, the control signal may be selected for optimum signal quality on each frequency.

Optionally the variable reactance means may comprise a bank of switchable inductors or a bank of switchable capacitors.

Optionally the signal quality may be one of signal strength, signal to noise ratio, bit error rate, timing jitter, and data eye opening.

BRIEF DESCRIPTION OF DRAWINGS

The present invention will now be described, by way of example, with reference to the accompanying drawings, wherein:

In the drawings the same reference numerals have been used to indicate corresponding features.

Referring to FIG. 1, the radio transceiver comprises an antenna 10 coupled to a tuneable antenna filter 12. An output of the antenna filter 12 is coupled to one side of a transmit/receive switch 14 which is controlled by a transmit/receive switch control stage 16 in a processing means 18. In the closed position of the switch 14 the transceiver operates in a receive mode in which a calibration signal may be applied by way of the antenna filter 12 to the receiver part of the transceiver either from an external signal source or from the transmit part of the transceiver by means of loop-back. When the switch 14 is open, the transceiver is in a transmit mode.

Figure 1:
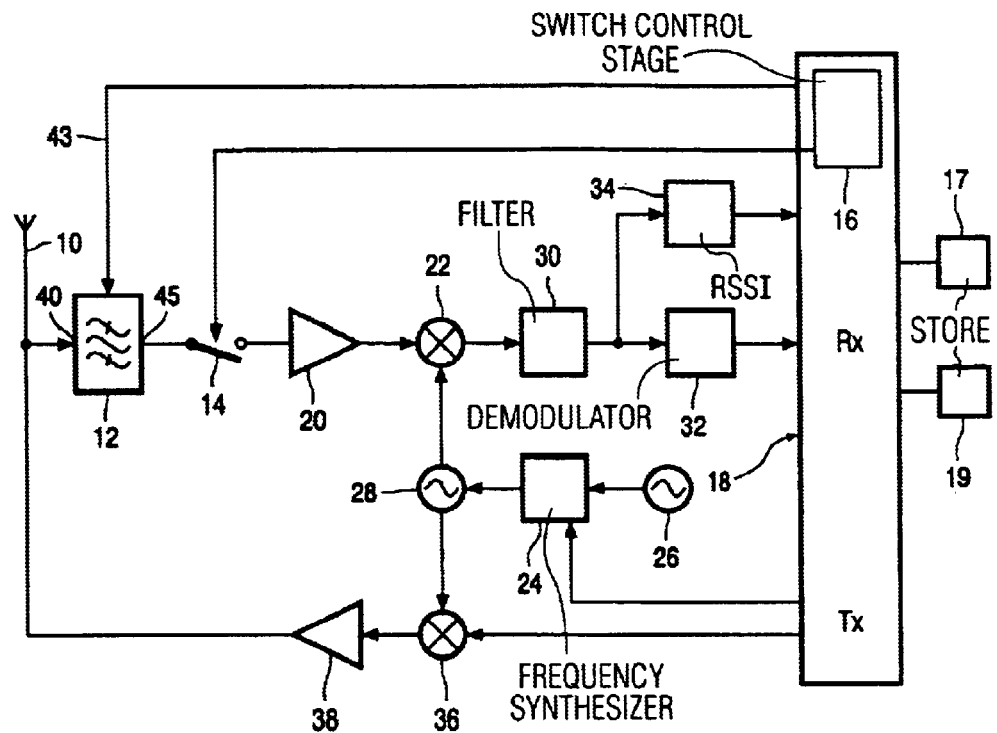
FIG. 1 is a block schematic diagram of a radio transceiver.

A low noise amplifier (LNA) 20 has an input coupled to the switch 14 and an output coupled to one input of a frequency down-converting stage which includes a mixer 22 and a source of local oscillator signals comprising a frequency synthesiser 24 which includes a reference oscillator 26 and a voltage controlled oscillator (VCO) 28. An output of the mixer 22 is coupled to a channel filter 30. A demodulator 32 and a radio signal strength indication (RSSI) stage 34 are coupled to an output of the channel filter 30. Outputs of the demodulator 32 and the RSSI stage 34 are applied to a receiver part Rx of the processing means 18. A first storage means 17 and a second storage means 19 are coupled to the processing means 18. The receiver part of the transceiver may be tuned to receive on any channel within the operating band of the transceiver by selecting an appropriate local oscillator frequency under the control of the processing means 18.

The transmitter part (Tx) of the processing means 18 is coupled to an input of a mixer 36 in which an input signal is frequency up-converted using a locally generated frequency derived from the frequency synthesizer 24. A linear power amplifier 38 is coupled between an output of the mixer 36 and the antenna 10. The transmit part of the transceiver may be tuned to transmit on any channel within the operating band of the transceiver by selecting an appropriate local oscillator frequency under the control of the processing means 18.

Figure 2:
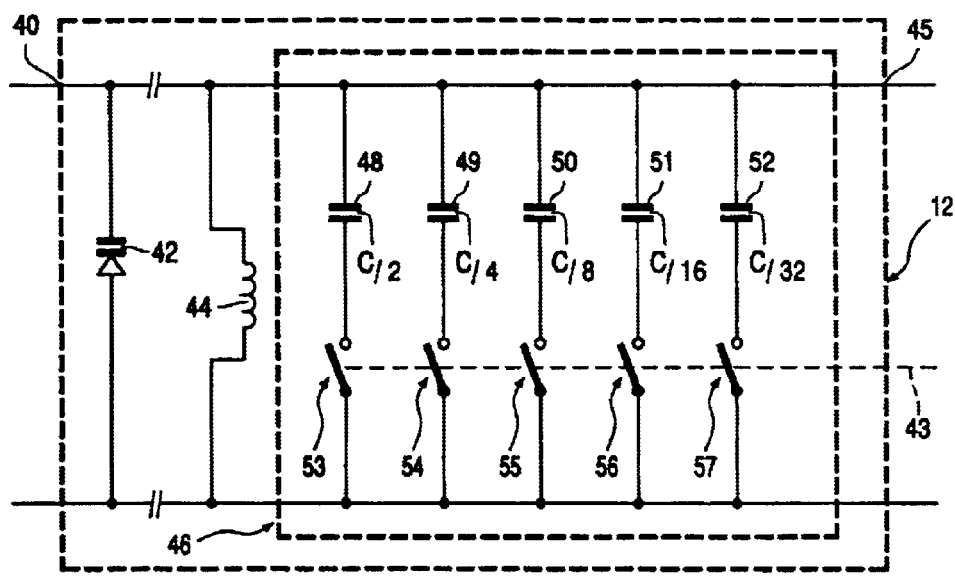
FIG. 2 is a schematic diagram of a tuneable filter.

Referring to FIG. 2, the tuneable antenna filter 12 is essentially a parallel LC stage comprising an input 40 coupled to a parallel tuned circuit formed by a varactor 42, an inductance 44 and a bank 46 of switchable passive capacitors 48, 49, 50, 51, 52 having geometrically related capacitance values of c/2, c/4, c/8, c/16 and c/32, respectively. Such a relationship of capacitance values enables a wide range of combined capacitance values to be obtained, and hence a wide tuning range for the filter. The capacitors 48 to 52 are coupled in series with switches 53 to 57, respectively. The switches 53 to 57 are controlled by the processing means 18 so that any capacitance value in a range of capacitance values from c/32 to 31c/32 is obtainable. The capacitors 48 to 52 are passive integrated capacitors and although the actual values of the respective capacitors are dependent on the processing tolerance of the IC wafer, their relative capacitance values are substantially unaltered because these are determined by their respective areas which are independent of the processing of the wafer.

The centre frequency, $f_r$, of the tuneable antenna filter 12 is related to the reciprocal of the square root of the product of inductance and capacitance, viz.

$$f_r = \frac{1}{\sqrt{LC}}$$

where C is the sum of the in-circuit capacitance values, and the centre frequency of the tuneable filter can be varied by switching one or more of the capacitors 48 to 52 into the circuit. The antenna filter 12 may be calibrated for a received signal of a particular frequency by supplying the antenna filter 12 with a calibration signal at a desired frequency and adjusting the switch settings until the signal strength measured by the RSSI stage 34 is maximised, and then storing this optimum switch setting in the second storage means 19. The signal may be either a simple tone or a modulated signal.

Figure 3:
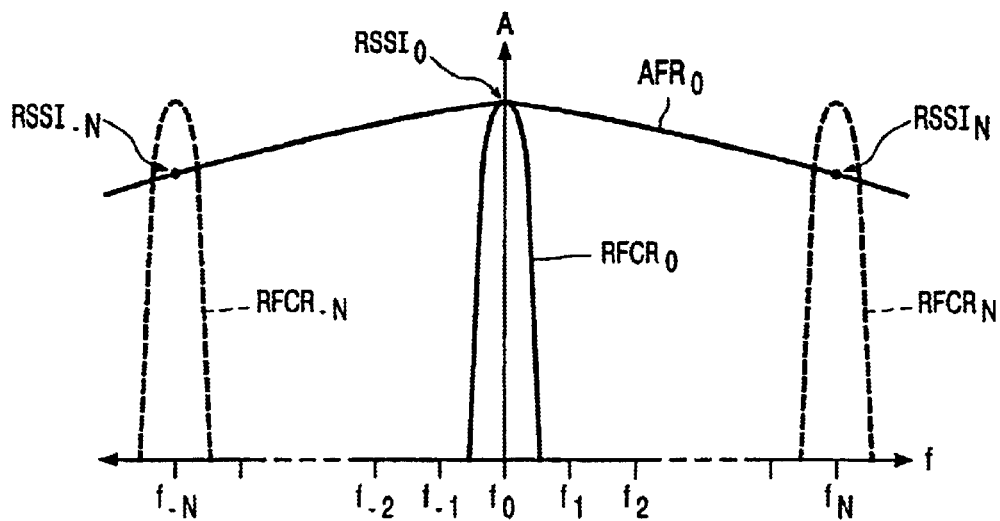
FIG. 3 is a graph of frequency f versus amplitude A (both logarithmic values) with the transceiver of FIG. 1 set to receive a channel in the centre of a frequency band.

For operating the transceiver over a band of channels, the optimum switch setting may be determined for a calibration signal at the centre frequency of the band and stored in the second storage means 19. This optimum switch setting would result in the frequency response of the antenna filter 12 being centred at the centre of the operating band. FIG. 3 shows the frequency response $AFR_0$ of the antenna filter 12 with the switch settings optimised for the centre frequency $f_0$ of the operating band, the operating band comprising channels at frequencies $f_{-N}$ to $f_N$, and the frequency response $RCFR_0$ of receiver channel filter 30 when the receiver is tuned by means of the frequency synthesiser 24 to receive the centre channel of the operating band at frequency $f_0$.

Also shown in FIG. 3 is the frequency response $RCFR_{-N}$ and $RCFR_N$ of the channel filter 30 when the receiver is tuned by means of the frequency synthesiser 24 to receive channels at the lower and upper band edges, at frequencies $f_{-N}$ and $f_N$ respectively. With the switch settings optimised for the centre frequency $f_0$ of the operating band, the measured RSSI for a received signal at the centre frequency is $RSSI_0$ and is optimum, but for a received signal at the lower and upper edges, $f_{-N}$ and $f_N$, the measured RSSI is $RSSI_{-N}$ and $RSSI_N$ respectively, which are both lower than the optimum value of $RSSI_0$, their values having being reduced by the roll-off of the frequency response $AFR_0$ of the antenna filter 12. For example, if the −3 dB bandwidth of the antenna filter 12 is 200 MHz, then if centred on the ISM band of 2.40 GHz to 2.48 GHz, its frequency response will be approximately 1 dB down at the upper and lower band edges. This means that when transmission occurs at the edge of the band, the sensitivity of the receiver will be decreased by 1 dB, which can lead to degradation or loss of signal.

The inferior sensitivity levels at either end of the operating band can be countered by switching the capacitance values such that when receiving a signal at the extreme ends $f_{-N}$, $f_N$ of the operating band, or indeed at any intermediate channel frequency, the signal is received with maximum signal strength $RSSI_0$, thus maximising the sensitivity level. The optimum switch settings for an operating band may be measured for all channels within the band, or for a sub-set of channels and interpolation or extrapolation of the capacitance values used for calculating the optimum switch settings for intermediate channels.

Determination of the optimum switch settings may only need to be undertaken once, at the time of manufacture. However with changing environmental factors, such as temperature variations, it may be necessary to repeat the determination of the optimum switch settings. In either case a simple and fast method is desirable.

The following calibration method provides a simple and fast way of determining optimum switch settings. The method requires data relating the degree of off-tune of the antenna filter to the consequent degradation of signal strength. Such data may be determined at the time of manufacture either by measurement or by calculation, in either case being stored in the first storage means 17. Alternatively, the data may be measured when the transceiver is in service, between periods of operation. The data needs to be determined only once; the data need not be determined again when the antenna filter is re-calibrated.

First, the frequency synthesiser 24 is set for the receiver to receive a channel at the centre frequency $f_0$ of the operating band, i.e. the mixer 22 will mix a signal at frequency $f_0$ into the pass-band of the channel filter 30, and the receiver is supplied, either from an external source or from the transmitter by loop-back, with a calibration signal at the centre frequency $f_0$ of the operating band.

Second, the switch settings are adjusted to give a maximum RSSI output, $RSSI_0$, thereby tuning the antenna filter 12 to have a peak in its frequency response $AFR_0$ at the frequency $f_0$. The value of $RSSI_0$ is stored in the second storage means 19.

Figure 4:
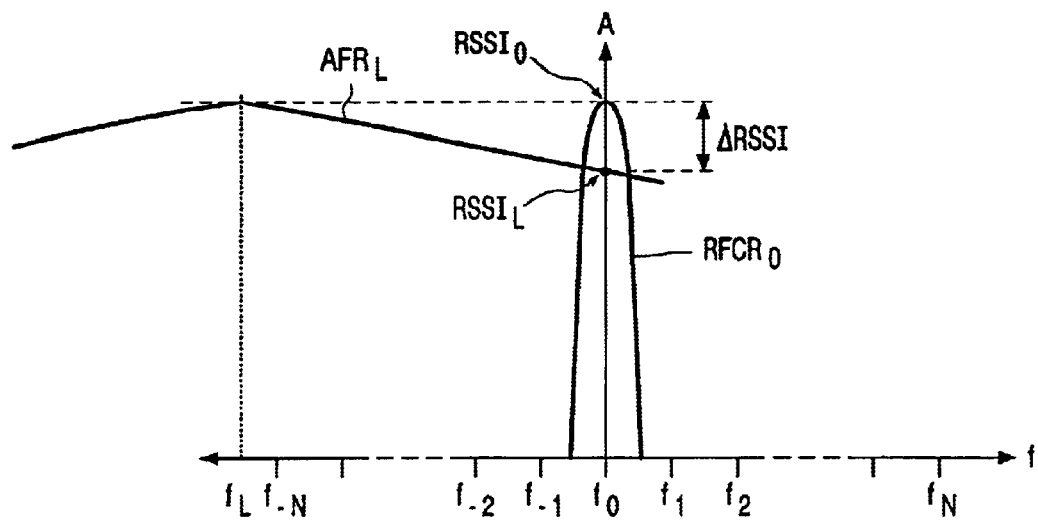
FIG. 4 is a graph of frequency f versus amplitude A (both logarithmic values) with the antenna filter centred at one of the furthest extremes of its tuning range.

Third, the switches 53 to 57 are adjusted to off-tune the antenna filter 12, still with the calibration signal at frequency $f_0$ and the receiver set by means of the frequency synthesiser to receive on the channel at $f_0$. By "off-tune", it is meant that the frequency response of the antenna filter 12 peaks at a frequency different from the frequency of the signal at the input 40 of the filter. The resulting RSSI is measured and stored in the second storage means 19. For example, the maximum or minimum capacitance value may be selected. FIG. 4 illustrates the case where the maximum capacitance is selected, resulting in the antenna filter 12 being tuned to peak at a frequency $f_L$ and having frequency response $AFR_L$. In this case the resulting RSSI level is $RSSI_L$, being lower than $RSSI_0$ by an amount $\Delta RSSI$. At this stage of the calibration process the value of the frequency $f_L$ is unknown.

Figure 6:
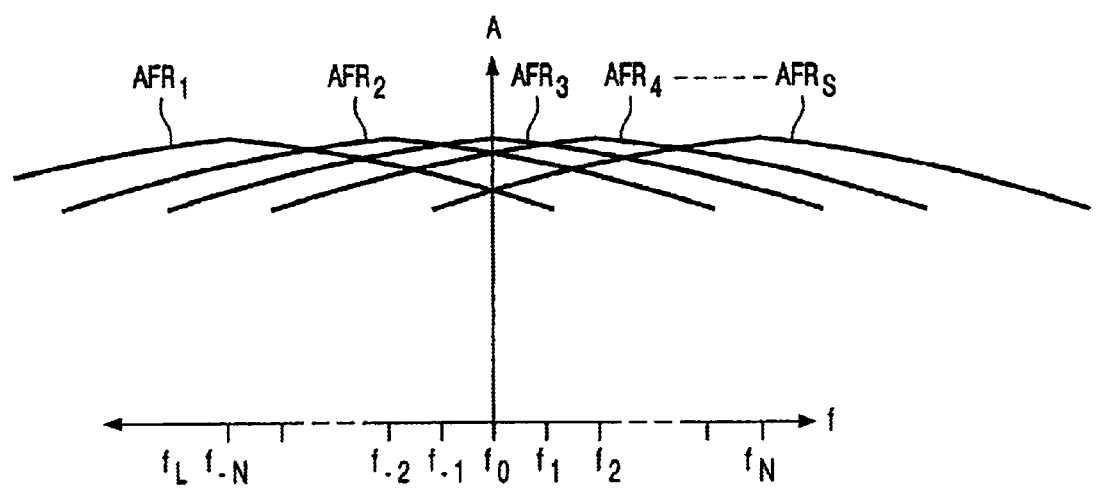
FIG. 6 is a graph of frequency f versus amplitude A (both logarithmic values) illustrating the antenna filter response for different values of capacitance in the frequency selective circuit shown in FIG. 2.

Fourth, the value of the frequency $f_L$ is determined as follows. Data relating the degree of off-tune of the antenna filter 12 to the consequent degradation in signal strength is stored in the first storage means 17. This data may be, for example, the order of the filter or the roll-off of the frequency response such as 6 dB per octave (or 20 dB per decade), or measured data of the antenna filter 12 frequency response. This stored data is sufficient to define the shape of the antenna filter 12 frequency response even though the tuning of the filter is unknown. From this stored data and the value of $RSSI_L$ measured in step three, the centre frequency $f_L$ of the off-tune antenna filter 12 is calculated by the processing means 18. An example of this calculation is illustrated in FIG. 6 using a trigonometric calculation on a right angled triangle. The value of the angle θ is known from the order of the filter, the frequency $f_0$ is predetermined, the value of $\Delta RSSI$ is known from the measurements and so the frequency $f_L$ can readily be determined by trigonometric calculation. Frequency $f_L$ and the settings of the switches 53 to 57 selected in step three is stored in the second storage means 19.

Fifth, steps three and four may be repeated with different settings of the switches 53 to 57 resulting in different degrees of off-tune of the antenna filter 12. In this way a set of calibration data relating the settings of the switches 53 to 57 to the resulting centre frequency of the antenna filter is generated and stored in the second storage means 19. Interpolation between, or extrapolation from, frequencies and switch settings may be used to reduce the number of measurements required to calibrate the antenna filter 12 over the whole operating range. Non-linearities in the antenna filter 12 circuit components mean that the frequency response will not necessarily be shifted by equal amounts for successive values of capacitance. Such non-linearities may be compensated for in the interpolation or extrapolation.

The same calibration process can be performed with the antenna filter 12 off-tuned on both sides of the centre frequency $f_0$ of the operating band.

Figure 5:
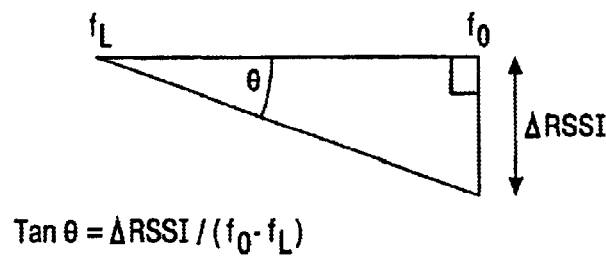
FIG. 5 illustrates using a right angled triangle to determine the frequency offset of the antenna filter from the centre of the frequency band.

FIG. 5 illustrates a set of antenna filter frequency responses $AFR_i$, i=1,S corresponding to S different settings of the switches 53–57.

The accuracy of the method is greatest for a filter having a distinct peak in its frequency response and for a filter having a steep roll-off in its frequency response.

In operation of the transceiver shown in FIG. 1, once the frequency of a desired received signal is known, the processing means 18 controls the frequency synthesiser 24 to align the frequency response RCFR of the receiver channel filter 30 on the desired channel and selects from the second storage means 19 the appropriate value of the capacitance switch settings 53–57 to give the best receiver sensitivity. In particular, for operation in a frequency hopped system, such as Bluetooth (Registered Trade Mark), once the sequence of frequency hopped signals is known, the processing means 18 can use the data stored in the second storage means 19 to select for each frequency the capacitance value giving the best sensitivity.

Optionally non-geometrically related capacitance values may be used in the bank 46 of switchable capacitors.

Although embodiment of the invention has been described in relation to a receiving device for receiving a radio signal and a tuneable filter for filtering a radio signal, the invention is not limited to apparatus for radio frequency signals.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of tuneable filters and component parts therefor and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

What is claimed is:

1. A signal receiving device comprising a tuneable filter and a control means, wherein the tuneable filter comprises an input for applying a signal at a first frequency, an output for delivering the filtered signal and a variable reactance means, and wherein the control means comprises means for generating a control signal for varying the reactance of the variable reactance means, measurement means for measuring a post-filter signal quality, first storage means comprising data relating the degree of off-tune of the filter to a consequent signal quality, and second storage means for storing an indication of a control signal value and an indication of a frequency, wherein the control means is operable to tune the filter to the input signal at the first frequency by determining a first value of the control signal which produces a peak signal quality, to off-tune the filter from the first frequency by selecting a second value of the control signal, to measure the off-tune signal quality, to determine a peak frequency of the off-tune filter by using the peak signal quality, the measured off-tune signal quality and the data relating the degree of off-tune to the consequent signal quality, and to store an indication of the second value of the control signal and an indication of the peak frequency of the off-tune filter.

2. A signal receiving device as claimed in claim 1, wherein the signal quality is one of signal strength, signal to noise ratio, bit error rate, timing jitter and an indication of data eye opening.

3. A signal receiving device as claimed in claim 1, wherein the control means is further operable to determine an indication of a further peak frequency and a corresponding further indication of the control signal by interpolation or extrapolation using at least one of the stored indications, and to store the indication of the further peak frequency and the corresponding further indication of the control signal.

4. A signal receiving device as claimed in claim 3, wherein the further peak frequency is a frequency of a frequency hopping sequence.

5. A signal receiving device as claimed in any one of claim 1, wherein the variable reactance means comprises a bank of selectable capacitors.

6. A signal receiving device as claimed in claim 5, wherein the selectable capacitors have geometrically related capacitance values.

7. A radio transceiver comprising a receiver part and a transmitter part, wherein the receiver part comprises a signal receiving device as claimed in claim 1.

8. A transceiver as claimed in claim 7, wherein the transmitter part comprises means for generating the signal at the first frequency, and further comprising means for coupling an output of the transmitter part to the input of the tuneable filter.

9. A method of calibrating a tuneable filter having a variable reactance means, the reactance of the variable reactance means being controllable by a control signal, the method comprising supplying the tuneable filter with a signal having a first frequency, tuning the filter by determining a first value of the control signal which produces a peak post-filter signal quality, off-tuning the filter by selecting a second value of the control signal and measuring the resulting off-tune signal quality, determining a peak frequency of the off-tune filter by using the peak signal quality, the off-tune signal quality and data relating the degree of off-tune to the consequent signal quality, and storing an indication of the second value of the control signal and an indication of the peak frequency of the off-tune filter.

10. A method of calibrating a tuneable filter as claimed in claim 9, wherein the signal quality is one of signal strength, signal to noise ratio, bit error rate, timing jitter and an indication of data eye opening.

11. A method of calibrating a tuneable filter as claimed in claim 9, further comprising detemining an indication of a further peak frequency and a corresponding further indication of the control signal by interpolation or extrapolation using at least one of the stored indications, and storing the indication of the further peak frequency and the corresponding further indication of the control signal.

12. A method of calibrating a tuneable filter as claimed in claim 11, wherein the further peak frequency is a frequency of a frequency hopping sequence.

13. A method of calibrating a tuneable filter as claimed in claim 9, wherein the variable reactance means comprises a bank of selectable capacitors.

14. A method of calibrating a tuneable filter as claimed in claim 13, wherein the selectable capacitors have geometrically related capacitance values.

* * * * *